United States Patent [19]

Miyamoto

[11] Patent Number: 5,246,888
[45] Date of Patent: Sep. 21, 1993

[54] METHOD OF PREVENTING CORROSION OF ALUMINUM ALLOYS

[75] Inventor: Hidenobu Miyamoto, Tokyo, Japan
[73] Assignee: NEC Corporation, Tokyo, Japan
[21] Appl. No.: 784,991
[22] Filed: Oct. 30, 1991
[30] Foreign Application Priority Data
  Oct. 30, 1990 [JP] Japan .................... 2-292876
[51] Int. Cl.$^5$ .................... H01L 21/465; C23F 1/00
[52] U.S. Cl. .................... 437/245; 437/246; 156/643; 156/665
[58] Field of Search ........... 437/246, 245; 156/643, 156/DIG. 61, 665

[56] References Cited

U.S. PATENT DOCUMENTS 4,267,013  5/1981  Iida et al. .................... 156/643

FOREIGN PATENT DOCUMENTS 59-119744  7/1984  Japan .................... 437/246
60-169140  9/1985  Japan .................... 156/643
61-242039  10/1986  Japan .................... 437/246
2-140923  5/1990  Japan .................... 156/643

Primary Examiner—John S. Maples
Attorney, Agent, or Firm—Sughrue, Mion, Zinn, Macpeak & Seas

[57] ABSTRACT

A method of preventing corrosion of aluminum alloys is disclosed, which comprises the steps of coating an aluminum alloy layer on a semiconductor substrate, forming a resist pattern on an aluminum alloy layer, dry etching the aluminum alloy with the resist pattern used as a mask and also using a chlorine-based gas, and subsequently carrying out a plasma process using a blend gas containing oxygen ($O_2$) and ammonia ($NH_3$) and a subsequent process of removing the resist using oxygen plasma. Even where there is not only aluminum alloy but an outer or inner layer of TiN, TiW, etc. to be etched, corrosion of the aluminum alloy can be prevented without etching the outer or inner layer at all and also without etching an inner insulating layer at all.

2 Claims, 2 Drawing Sheets

FIG. 2

| ACCELERATION TEST PROCESS TIME | AMMONIA PROPORTION (%) | | | | | |
|---|---|---|---|---|---|---|
| | 0 | 10 | 20 | 30 | 50 | 100 |
| 10 MIN | XX | 0 | 0 | 0 | 0 | 0 |
| 20 MIN | XX | 0 | 0 | 0 | 0 | 0 |
| 30 MIN | XX | 0 | 0 | 0 | 0 | 0 |
| 40 MIN | XX | 0 | 0 | 0 | X | X |
| 50 MIN | XX | 0 | 0 | 0 | X | X |
| 60 MIN | XX | 0 | 0 | X | X | X |

0: NO CORROSION NOTICED
X: CORROSION NOTICED
XX: GREAT CORROSION NOTICED

METHOD OF PREVENTING CORROSION OF ALUMINUM ALLOYS

BACKGROUND OF THE INVENTION

1. Field of the Invention

This invention relates to a method of preventing corrosion of aluminum alloys and, more particularly, to a method of preventing corrosion of aluminum alloys, which have been coated on semiconductor substrates and dry etched using chlorine-based gases.

2. Description of the Related Art

The dry etching of aluminum or alloys thereof using chlorine-based gases is posing a problem of corrosion of the aluminum or alloys thereof due to residual chlorine component. There is also a recent demand for aluminum alloy leads, which do not only incorporate copper but also use such a barrier metal as TiN or TiW as an inner layer under the aluminum alloy film. Where the barrier metal such as TiN or TiW is provided as an inner layer, corrosion takes place more readily compared to the case of single aluminum alloy layer leads. This means that the former case requires a more complete corrosion prevention measure. Heretofore, there are the following measures against corrosion of aluminum alloys, particularly Al-Cu alloys, having been dry etched using chlorine-based gases.

(1) The resist is removed while continually maintaining a vacuum after the dry etching. This is done by microwave down-flow ashing using a gas containing oxygen ($O_2$) and carbon tetrafluoride ($CF_4$).

(2) After the dry etching, a plasma processing is carried out using a fluorine-based gas such as $CF_4$, $SF_6$ and $CHF_3$, as disclosed in, for instance, Japanese Patent Publication No. 12,343/1983.

(3) After the dry etching, a thermal treatment is carried out at a temperature of 270° C. or above, as disclosed in, for instance, Japanese Patent Disclosure No. 58,835/1988.

However, with any of the sole aluminum alloy corrosion prevention measures (1), (2) or (3) as above, the effect of corrosion prevention is insufficient, and it is necessary to carry out right afterwards a wet process using an alkali solution or an acid. In addition, where there is a film as an inner layer under aluminum alloy and the alloy is to be etched using a fluorine-based gas, there is a problem of side etching of TiN or TiW during a corrosion prevention process using a fluorine-based gas. Further, where the semiconductor substrate is heated to 270° C. or above after the etching, hillocks are formed on the aluminum alloy film to deteriorate the reliability thereof.

SUMMARY OF THE INVENTION

The present invention has an object of providing a method preventing corrosion of aluminum alloys, which has an effect that even where there is not only aluminum alloy but an outer or inner layer of TiN, TiW, etc. to be etched with a fluorine-based gas, it can ensure the prevention of the aluminum alloy film corrosion without etching the outer or inner layer at all and also without etching an inner insulating layer at all.

The aluminum alloy corrosion prevention method according to the invention comprises the steps of coating an aluminum alloy layer on a semiconductor substrate, forming a resist pattern on the aluminum alloy layer, dry etching the aluminum alloy with the resist pattern used as a mask and also using a chlorine-based gas, and subsequently carrying out a plasma process using a blend gas containing oxygen ($O_2$) and ammonia ($NH_3$) and a subsequent process of removing the resist using oxygen plasma.

Effectively, the proportion of ammonia ($NH_3$) in the gas flow is 5 to 25%, the semiconductor substrate heating temperature is 150° to 250° C., and as the plasma is used down-flow plasma is generated by microwave or high frequency excitation.

BRIEF DESCRIPTION OF THE DRAWINGS

FIG. 2 is a table showing results of a test in a first example of the invention.

DETAILED DESCRIPTION OF THE PREFERRED EMBODIMENT OF THE INVENTION

Figure 1A:
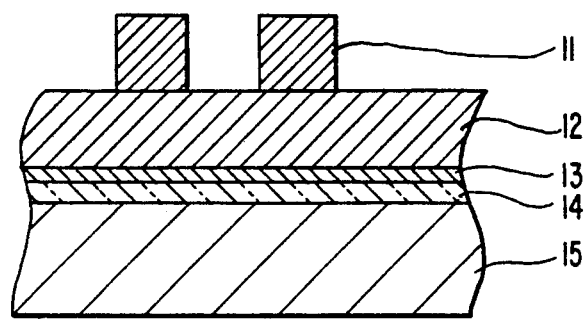
FIGS. 1(a) to 1(c) are sectional views showing the steps of manufacture in an embodiment of the invention.
Figure 1B:
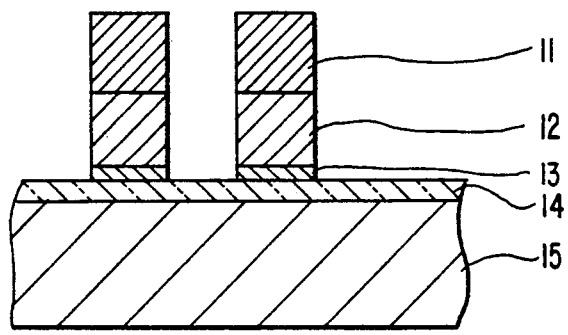
Figure 1C:
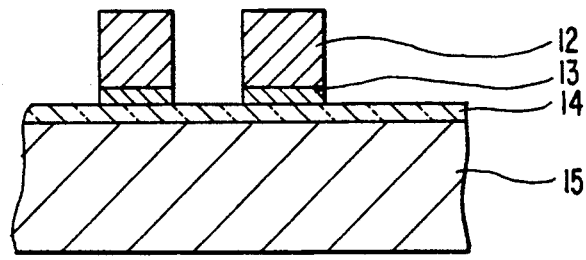

The invention will now be described with reference to the drawings. FIGS. 1(a) to 1(c) are sectional views illustrating the steps of manufacture in an embodiment of the invention.

Referring to FIG. 1(a), an oxide film 14 with a thickness of 4,000 angstroms is formed on a semiconductor substrate 15. Then, a TiN film with a thickness of about 1,000 angstroms and an Al-Si-Cu film 12 with a thickness of about 10,000 angstroms are formed by a spattering process on the TiN film 13. Thereafter, a photo-resist pattern 11 is formed by a usual lithographic process. Then, the Al-Si-Cu and TiN films 12 and 13 are etched by a RIE process with the photo-resist 11 used as a mask.

As an example, the RIE was carried out using an etching gas containing 70 sccm of $BCl_3$, 30 sccm of $Cl_2$, 15 sccm of $CHCl_3$ and 150 sccm of $N_2$. The pressure of the gas was reduced to 0.3 Torr, and in this state a 13.56 MHz power of 300 W was applied for 3 minutes. Then, the semiconductor substrate right after the etching was held in down-flow plasma asher while continually maintaining vacuum. In this state, a process using an oxygen-ammonia blend gas plasma was carried out, and then a continual process of photo-resist removal with an oxygen plasma was carried out. At this time, the semiconductor substrate was heated to 200° C. As the conditions of the oxygen-ammonia blend gas plasma process, the 13.56 MHz power level was set to 300 W, the pressure was set to 0.75 Torr, the total gas flow rate was set to 500 sccm, and the ammonia proportion was set to 0, 10, 20, 30, 50 and 100%. The process time was set to 2 minutes. The ashing with the oxygen plasma was carried out by setting a 13.56 MHz power level of 300 W, a pressure level of 0.75 Torr, a gas flow rate of 500 sccm and a process time of 2 minutes.

The semiconductor substrate was then taken out into atmosphere and subjected to a corrosion generation acceleration test by leaving it in a steam atmosphere. During the acceleration test, the generation of corrosion was checked by observing the semiconductor substrate with a microscope for every proportion of ammonia at an interval of 10 minutes. The results of the test are shown in FIG. 2. As is seen from the FIG. 2, the corrosion prevention effect is highest with ammonia proportions of 10 and 20%. Subsequently, a corrosion generation test was conducted separately from the above acceleration test by leaving the semiconductor substrate having been processed with an ammonia proportion of 20% in a clean room. No corrosion was observed after more than 88 hours.

A second example will now be described. In this example, the aluminum alloy structure and the apparatus and conditions of the aluminum alloy etching were the same as those in the preceding first example, while a microwave down-flow plasma asher at a frequency of 2.45 GHz was used. As conditions of the oxygen-ammonia blend gas plasma process, the semiconductor substrate heating temperature was set to 200° C., the microwave power level was set to 400 mA as magnetron anode current, the pressure was set to 1.2 Torr, the oxygen and ammonia flow rates were set to 400 and 100 sccm, respectively, and the process time was set to 2 minutes. The subsequent ashing with oxygen plasma was carried out for one minute with the semiconductor substrate heating temperature set to 200° C., the magnetron anode current set to 400 mA, the pressure set to 1.4 Torr and the oxygen flow rate set to 200 sccm.

The substrate was then taken out into the atmosphere and left in a clean room to observe generation of corrosion. No corrosion was observed for more than 5 days. It will be seen that by using a microwave down-flow asher for the down-flow plasma process, the plasma density can be increased to obtain a reduction of the time and an increase of the effect of the corrosion prevention process.

As has been described in the foregoing, according to the invention, after an aluminum alloy layer coated on a semiconductor substrate has been dry etched using a chlorine-based gas, a down-flow plasma process using an oxygen/ammonia blend gas plasma and a down-flow plasma ashing process using oxygen gas are performed. Thus, even where there is not only aluminum alloy but an outer or inner layer of TiN, TiW, etc. to be etched with a fluorine-based gas, the corrosion of the aluminum alloy film can be prevented without etching the outer or inner layer at all and also without etching an inner insulating film at all.

The method according to the invention permits extension of the permissible time period before the generation of corrosion after the processed semiconductor substrate has been taken out into the atmosphere, thus permitting ready process automation.

What is claimed is:

1. A method of preventing corrosion of aluminum alloys, comprising the steps of coating an aluminum alloy layer on a semiconductor substrate, forming a resist pattern on the aluminum alloy layer, dry etching the aluminum alloy with the resist pattern used as a mask and also using a chlorine-based gas, and subsequently carrying out a plasma process using a blend gas containing oxygen ($O_2$) and ammonia ($NH_3$) and a subsequent process of removing the resist using oxygen plasma, wherein said ammonia is 5 to 25% of said blend gas, and wherein said plasma gas process using said oxygen-ammonia blend gas and said resist removal process using oxygen plasma are carried out by heating said semiconductor substrate to 150° to 225° C.

2. The method of preventing corrosion of aluminum alloys according to claim 1, wherein said oxygen-ammonia gas plasma and said oxygen plasma are each a down-flow plasma obtained by microwave or high frequency excitation.

* * * * *